(12) United States Patent
Hayase

(10) Patent No.: US 9,728,317 B2
(45) Date of Patent: Aug. 8, 2017

(54) NOISE SUPPRESSION MEMBER

(71) Applicant: Kitagawa Industries Co., Ltd., Aichi (JP)

(72) Inventor: Kazuyuki Hayase, Kasugai (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 0 days.

(21) Appl. No.: 15/229,468

(22) Filed: Aug. 5, 2016

(65) Prior Publication Data

US 2017/0040096 A1    Feb. 9, 2017

(30) Foreign Application Priority Data

Aug. 7, 2015 (JP) ................................. 2015-157200

(51) Int. Cl.
| | |
|---|---|
| *H05K 9/00* | (2006.01) |
| *H01F 17/06* | (2006.01) |
| *H01F 27/02* | (2006.01) |
| *H01F 27/06* | (2006.01) |

(52) U.S. Cl.
CPC ............ *H01F 17/06* (2013.01); *H01F 27/02* (2013.01); *H01F 27/06* (2013.01); *H05K 9/0007* (2013.01); *H05K 9/0066* (2013.01); *H01F 2017/065* (2013.01)

(58) Field of Classification Search
CPC ......................... H01F 2017/065; H05K 9/0066
See application file for complete search history.

(56) References Cited

U.S. PATENT DOCUMENTS

| | | | | | |
|---|---|---|---|---|---|
| 4,970,476 | A | * | 11/1990 | Kitagawa ................. | H01F 3/08 333/12 |
| 5,162,772 | A | * | 11/1992 | May ........................ | H01F 17/06 174/92 |
| 6,605,775 | B1 | * | 8/2003 | Seeber ................... | H05K 9/0066 174/359 |
| 6,633,000 | B2 | * | 10/2003 | Kuo ....................... | H05K 9/0066 174/92 |
| 6,867,362 | B2 | * | 3/2005 | Cherniski ............... | H05K 9/0066 174/36 |
| 7,221,235 | B2 | * | 5/2007 | Gilliland ................. | H01F 21/06 333/12 |
| 9,117,587 | B2 | * | 8/2015 | Nagata .................... | H01F 17/06 |
| 2007/0247271 | A1 | * | 10/2007 | Grupa ..................... | H01F 17/06 336/223 |
| 2011/0031006 | A1 | * | 2/2011 | Chen ...................... | H05K 9/0066 174/350 |
| 2013/0002104 | A1 | * | 1/2013 | Chen ...................... | C04B 35/486 312/223.1 |

FOREIGN PATENT DOCUMENTS

JP            H0359693         3/1991

* cited by examiner

*Primary Examiner* — Hung V Ngo
(74) *Attorney, Agent, or Firm* — Jenkins, Wilson, Taylor & Hunt, P.A.

(57) ABSTRACT

A noise suppression member comprising: a plurality of magnetic cores, and a case for arranging and housing the plurality of magnetic cores; the noise suppression member being configured such that a restraining member can be attached, the restraining member restraining a cable in a state of contact with an inner periphery of the plurality of magnetic cores at a location between an adjacent two of the plurality of magnetic cores, by coming into contact with the cable passing through an inner peripheral side of the plurality of magnetic core.

5 Claims, 7 Drawing Sheets

NOISE SUPPRESSION MEMBER

CROSS-REFERENCE TO RELATED APPLICATION

This application is a continuation of and claims the benefit of Japanese Patent Application No. 2015-157200 filed Aug. 7, 2015 in the Japan Patent Office, and the entire disclosure of Japanese Patent Application No. 2015-157200 is incorporated by reference herein.

BACKGROUND

The present invention relates to a noise suppression member.

Conventionally, products including a magnetic core constituted by a pair of split cores being brought into contact so as to form an annular shape and a case for housing the magnetic core are known as noise suppression members to be attached to electrical cables to attenuate noise current (e.g. see Patent Literature 1: Japanese Unexamined Utility Model Application Publication No. H03-059693).

In the case of the noise suppression member described in Patent Literature 1, the noise suppression member is configured such that a cable fastener 16 can be attached and the noise suppression member can be attached using the cable fastener so as not to move with respect to the cable.

SUMMARY

However, as a result of diligent research, the present inventor has discovered that for this type of noise suppression member, impedance characteristics are improved more in cases where the cable comes into contact with an inner peripheral surface of the magnetic core than in cases where the cable is in the center of the magnetic core.

For example, in FIG. 11 of Patent Literature 1 described above, an example is illustrated in which the cable is disposed at a position biased against the center of the magnetic core.

However, in the technology described in Patent Literature 1, as illustrated in FIG. 10 of Patent Literature 1, the cable fastener is disposed at a position separated from between both ends in an axial direction of the magnetic core. Consequently, while the cable can be brought close to the inner peripheral surface of the magnetic core on a first side of the both sides sandwiching the position where the cable fastener is disposed, the cable cannot be brought close to the inner peripheral surface of the magnetic core on a second side because the cable fastener does not exist on the second side. Additionally, even on the first side, the cable is more prone to separating from the magnetic core the greater the distance from the cable fastener. Accordingly, with a cable fastener such as that described in Patent Literature 1, the cable cannot be caused to make sufficient contact with the inner peripheral surface of the magnetic core and, on this point, there is room for improvement.

In light of the foregoing, provision is desirable for a noise suppression member by which a cable passing through a magnetic core can be caused to make excellent contact with an inner peripheral surface of the magnetic core.

A noise suppression member described below includes a plurality of magnetic cores, each being configured in an annular shape, and a case for arranging and housing the plurality of magnetic cores in an axial direction orthogonal to a radial direction of each of the plurality of magnetic cores. Each of the plurality of magnetic cores is formed into the annular shape by bringing a pair of split cores constituted by a magnetic material into contact with each other. Moreover, the case includes a pair of housings and an engagement mechanism capable of mutually fixing the pair of housings. The plurality of magnetic cores is constituted by a plurality of the split cores housed in a first housing of the pair of housings and a plurality of the split cores housed in a second housing of the pair of housings being brought into contact with each other on a one-to-one basis as a result of the pair of housings being mutually fixed by the engagement mechanism. Additionally, the noise suppression member is configured such that a restraining member can be attached. The restraining member restrains a cable in a state of contact with an inner periphery of the magnetic cores at a location between the magnetic cores disposed in the case at adjacent positions that are separated by a space, by coming into contact with the cable passing through an inner peripheral side of the magnetic cores.

According to the noise suppression member configured thusly, the plurality of magnetic cores can be housed in the case, and the restraining member described above can be attached to the location between the magnetic cores disposed in the case at adjacent positions that are separated by a space. When the restraining member is attached to the case, the restraining member comes into contact with the cable passing through the inner peripheral side of the magnetic cores and, thus, restrains the cable in a state of contact with the inner periphery of the magnetic cores.

Therefore, the cable can be brought into contact with the inner periphery of the magnetic cores on both sides between which the restraining member is interposed. Accordingly, compared to, for example, a configuration in which the cable is brought close to the inner periphery of a single magnetic core at a location outward of an edge of the magnetic core, with the present invention, the cable can be disposed close to the inner periphery of the magnetic core across a greater range. As a result, the impedance characteristics of the noise suppression member can be enhanced, and the effects of countering electromagnetic waves can be enhanced.

BRIEF DESCRIPTION OF THE DRAWINGS

Embodiments of the present disclosure will be illustrated with reference to the accompanying drawings, in which.

DETAILED DESCRIPTION

Figures 1A, 1B, 1C:
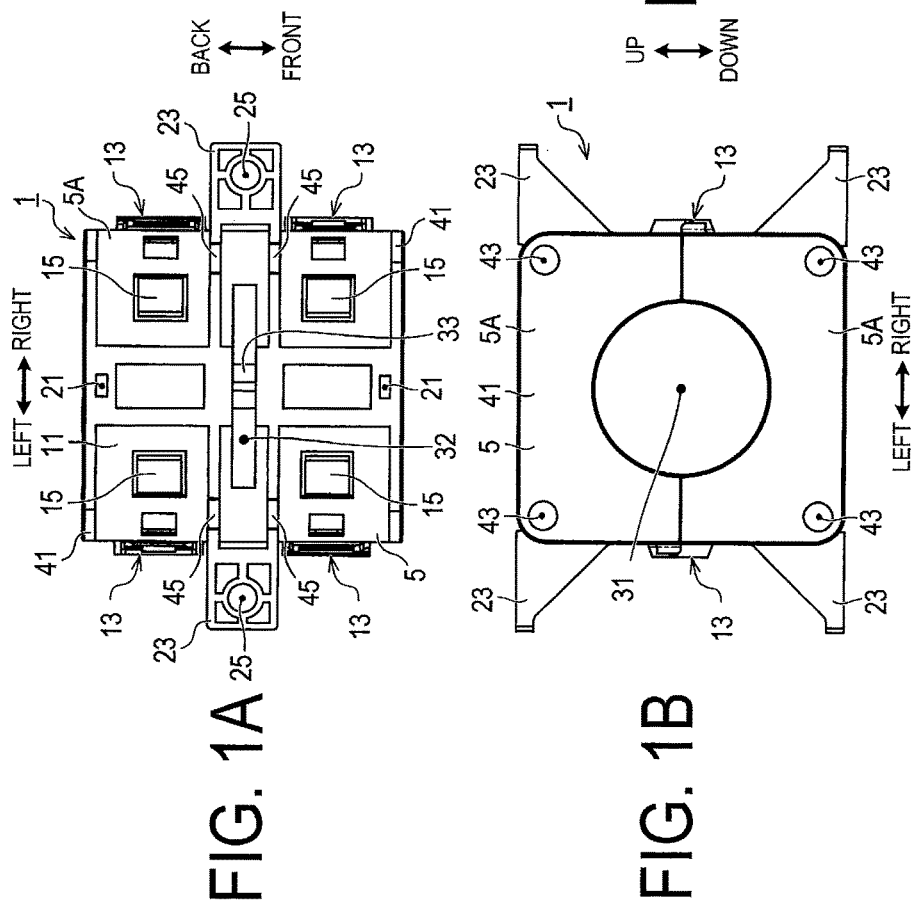
FIG. 1A is a plan view of a noise suppression member.
FIG. 1B is a front view of the noise suppression member.
FIG. 1C is a right-side view of the noise suppression member.

Next, the noise suppression member described above will be explained using an exemplary embodiment.
(1) Configuration of the Noise Suppression Member FIG. 1A is a plan view of a noise suppression member 1, FIG. 1B is a front view of the noise suppression member 1, and FIG. 1C is a right-side view of the noise suppression member 1. In the present embodiment, a bottom view of the noise suppression member 1 appears the same as the plan view. Additionally, a back view of the noise suppression member 1 appears the same as the front view. Moreover, a left-side view of the noise suppression member 1 appears the same as the right-side view. In the following description, a direction that each of the constituents illustrated in the plan view of FIG. 1A face is defined as up and an opposite direction is defined as down; a direction that each of the constituents illustrated in the front view of FIG. 1B face is defined as front and an opposite direction is defined as back; and a direction that each of the constituents illustrated in the right-side view of FIG. 1C face is defined as right and an opposite direction is defined as left. Relative positional relationships of each of the constituents of the noise suppression member 1 will be described using these directions. These directions are also noted in each of the drawings. However, when actually using the noise suppression member 1, the noise suppression member 1 may be oriented in any direction. For example, the noise suppression member 1 may be used in a state where the up-down direction illustrated in the drawings does not match the vertical direction due to the relationship of the up-down direction with gravity.

Figure 2A:
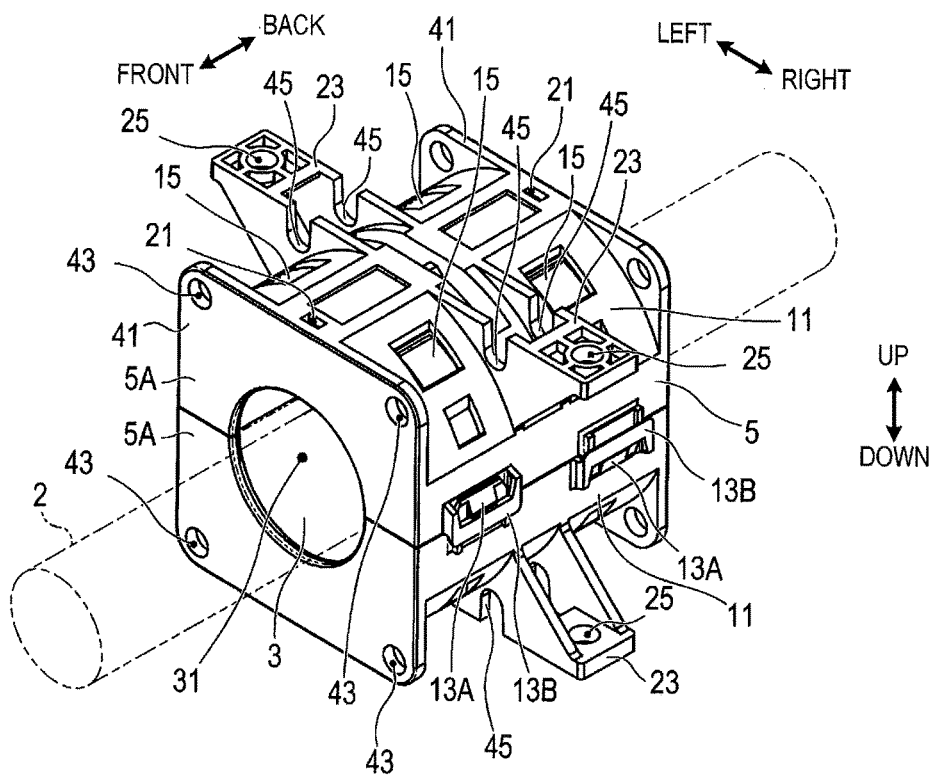
FIG. 2A is a perspective view of the noise suppression member, viewed from the upper right front.
Figure 2B:
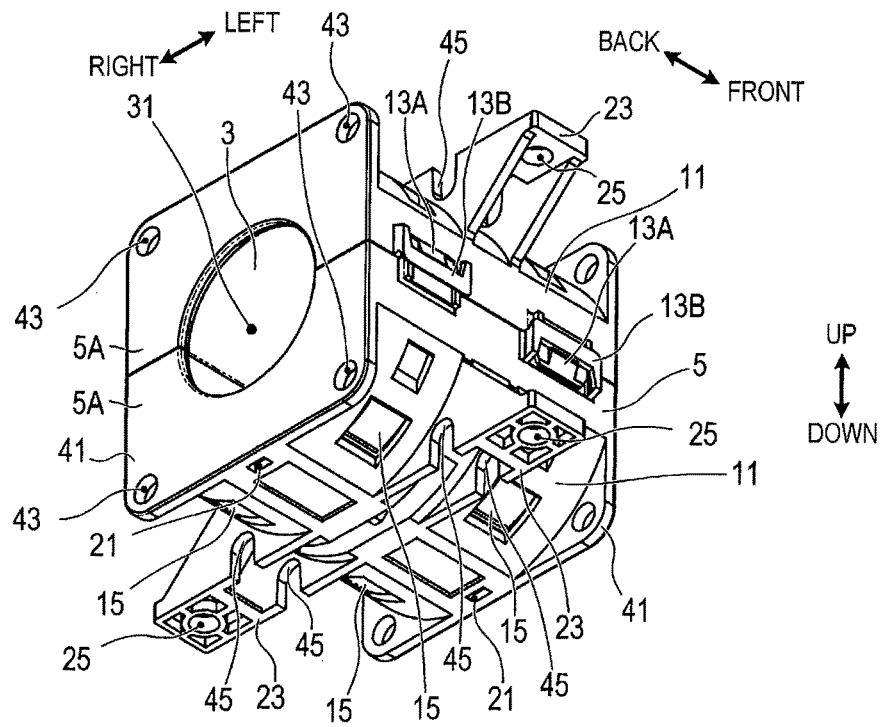
FIG. 2B is a perspective view of the noise suppression member, viewed from the lower left back.
Figure 3:
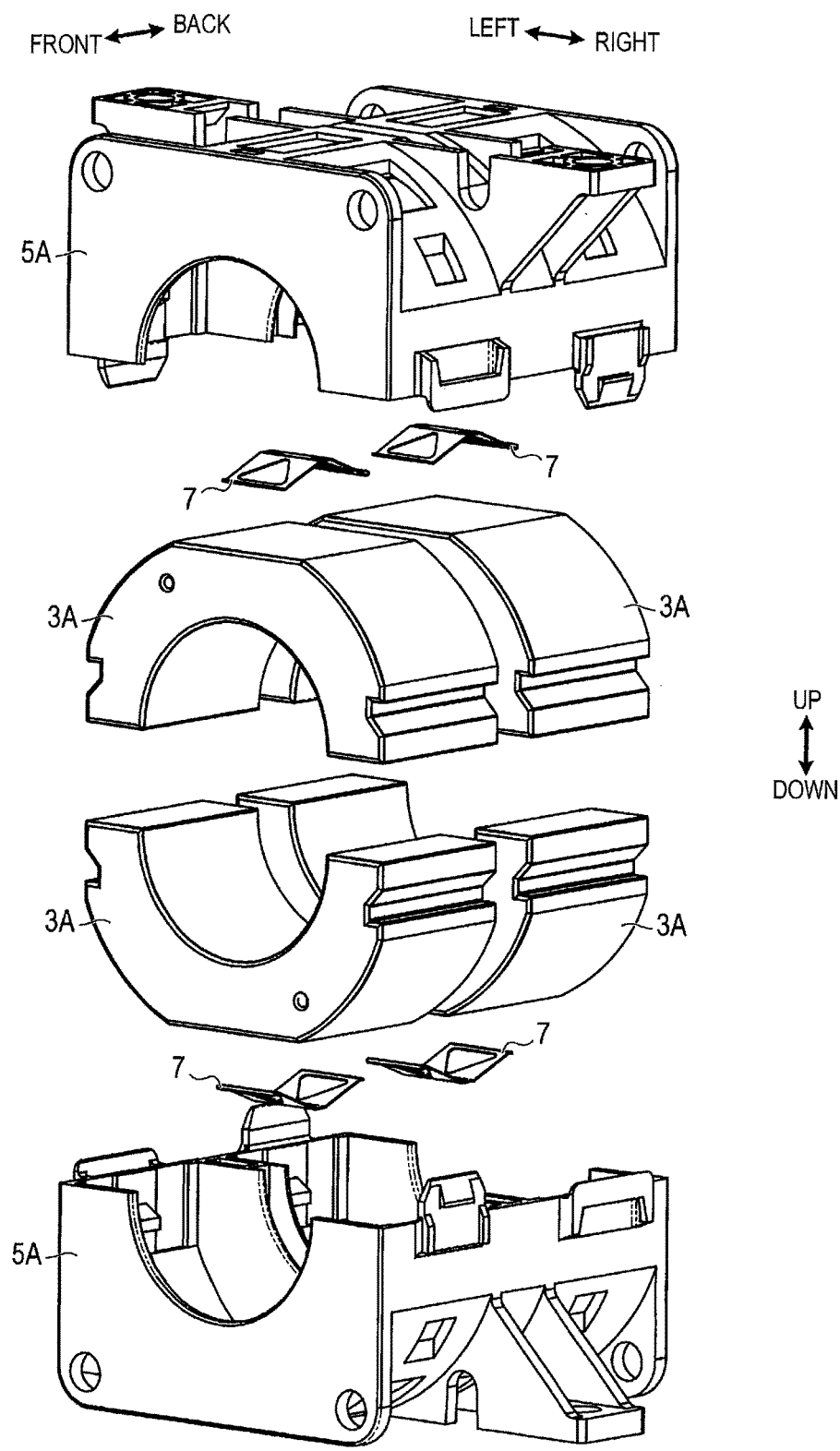
FIG. 3 is an exploded perspective view illustrating the noise suppression member.

As illustrated in FIGS. 2A and 2B, the noise suppression member 1 is mounted on an outer periphery of a cable 2, and attenuates noise current flowing in the cable 2. In the present embodiment, as illustrated in FIG. 3, the noise suppression member 1 includes four split cores 3A, 3A, 3A, 3A, two case parts 5A, 5A, and four metal springs 7, 7, 7, 7.

The four split cores 3A, 3A, 3A, 3A are constituted by a magnetic material (in the present embodiment, manganese ferrite, but other magnetic materials are also possible), and each is configured to have the same shape. One magnetic core 3 is constituted by bringing two split cores 3A, 3A into contact with each other as a pair so as to be arranged in an annular shape. In the present embodiment, two magnetic cores 3, 3 are constituted by the four split cores 3A, 3A, 3A, 3A.

The two case parts 5A, 5A are constituted by a resin material (in the present embodiment, polyamide resin, but other resin materials are also possible), and both are configured to have the same shape. One case 5 is constituted by the two case parts 5A, 5A being fixed to each other. More specifically, each of the case parts 5A includes a housing 11 for arranging and housing the two split cores 3A, 3A so as to be separated by a space, two engaging portions 13A, 13A, and two engaged portions 13B, 13B. The engaging portion 13A of one of the case parts 5A and the engaged portion 13B of the other of the case parts 5A correspond on a one-to-one basis and constitute one set of an engagement mechanism 13. Thus, four sets of the engagement mechanisms 13, 13, 13, 13 are constituted in the case 5.

When the four sets of the engagement mechanisms 13, 13, 13, 13 are engaged, the pair of housings 11, 11 can be fixed to each other. At this time, the two split cores 3A, 3A housed in one of the housings 11 and the split cores 3A, 3A housed in the other of the housings 11 come into contact with each other on a one-to-one basis. Thus, two magnetic cores 3, 3 are constituted in the case 5. The case 5 arranges and houses the two magnetic cores 3, 3 in an axial direction orthogonal to a radial direction of each of the magnetic cores 3, 3.

Eight resin springs 15, 15 . . . are provided in the case 5. Each of the resin springs 15 is formed integrally with other portions as a portion of the case part 5A. In a plan view (or a bottom view) of one of the resin springs 15, locations corresponding to three sides of a quadrilateral are surrounded by space, a location corresponding to the remaining one side is in continuity with the case part 5A, and the resin spring 15 extends in a circumferential direction of the case 5 from the continuous location. When the four sets of the engagement mechanisms 13, 13, 13, 13 are engaged, the resin springs 15 are subjected to forces acting from the split cores 3A, elastically deform, and press on the split cores 3A via elastic force produced thereby.

Figure 4A:
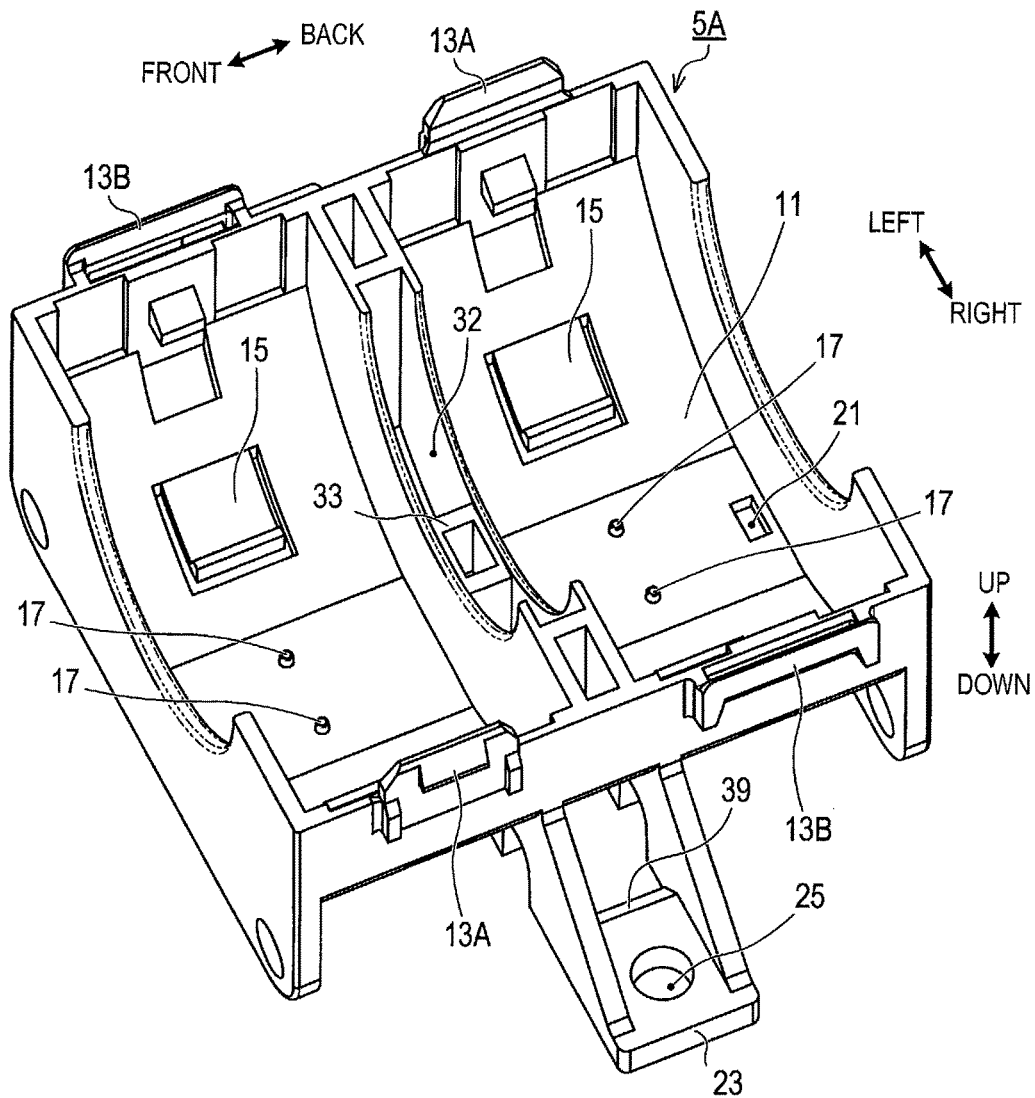
FIG. 4A is a perspective view of a case part.
Figure 4B:
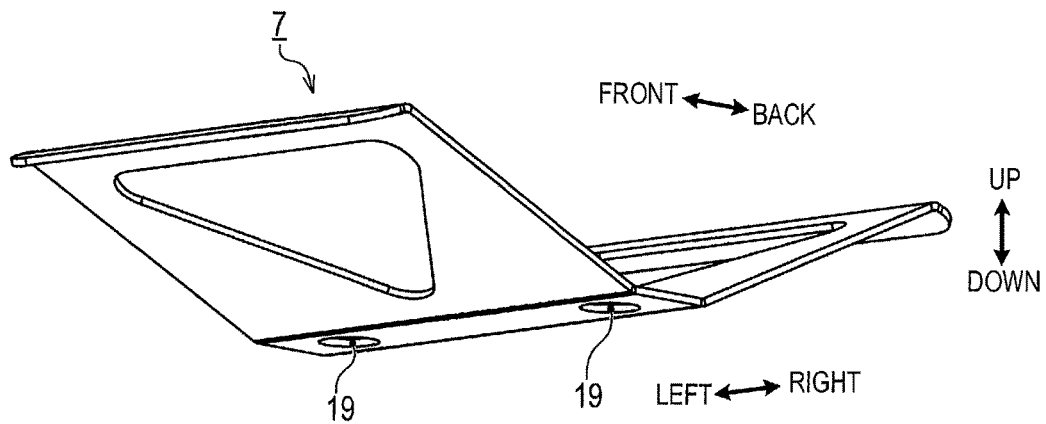
FIG. 4B is a perspective view of a metal spring.

At this time, the metal springs 7 are also subjected to forces acting from the split cores 3A, elastically deform, and press on the split cores 3A via elastic force produced thereby. In a right-side view, each of the metal springs 7 is a thin metal plate forming a V-shape, and is interposed between each of the split cores 3A and the housing 11. As illustrated in FIG. 4A, two sets of paired protrusions 17, 17 are provided on an inner side of the housing 11. As illustrated in FIG. 4B, protrusion receiving holes 19, 19 corresponding to the protrusions 17, 17 are provided in the metal springs 7. By inserting the protrusions 17, 17 in the protrusion receiving holes 19, 19, the metal springs 7 can be held so as not to become displaced with respect to the housing 11.

Through bores 21, 21, 21, 21 penetrating in the up-down direction of the housing 11 are provided in the case 5, in a top surface and a bottom surface near both edges in the front-back direction defined in the drawings. The metal springs 7 disposed in the case 5 can be seen through the through bores 21. Thus, even after the noise suppression member 1 has been assembled, post-assembly confirmation as to whether or not the metal springs 7 have been provided in the case 5 can be easily performed.

As illustrated in FIGS. 2A, 2B, and the like, four legs 23, 23, 23, 23 are provided near the center of the case 5 in the front-back direction defined in the drawings. An attachment hole 25 penetrating in the up-down direction defined in the drawings is provided in each of the legs 23. When attaching the noise suppression member 1 to an attaching location (e.g. a panel, stay, or the like; not illustrated), two legs 23, 23 on the top side or the bottom side defined in the drawings are brought into contact with the attaching location. Then, a shaft of a fixing member (e.g. a bolt, rivet, screw, or the like; not illustrated) is inserted through the attachment hole 25, and the fixing member is fixed to the attaching location. Thus, the noise suppression member 1 can be fixed to the attaching location.

Figure 5A:
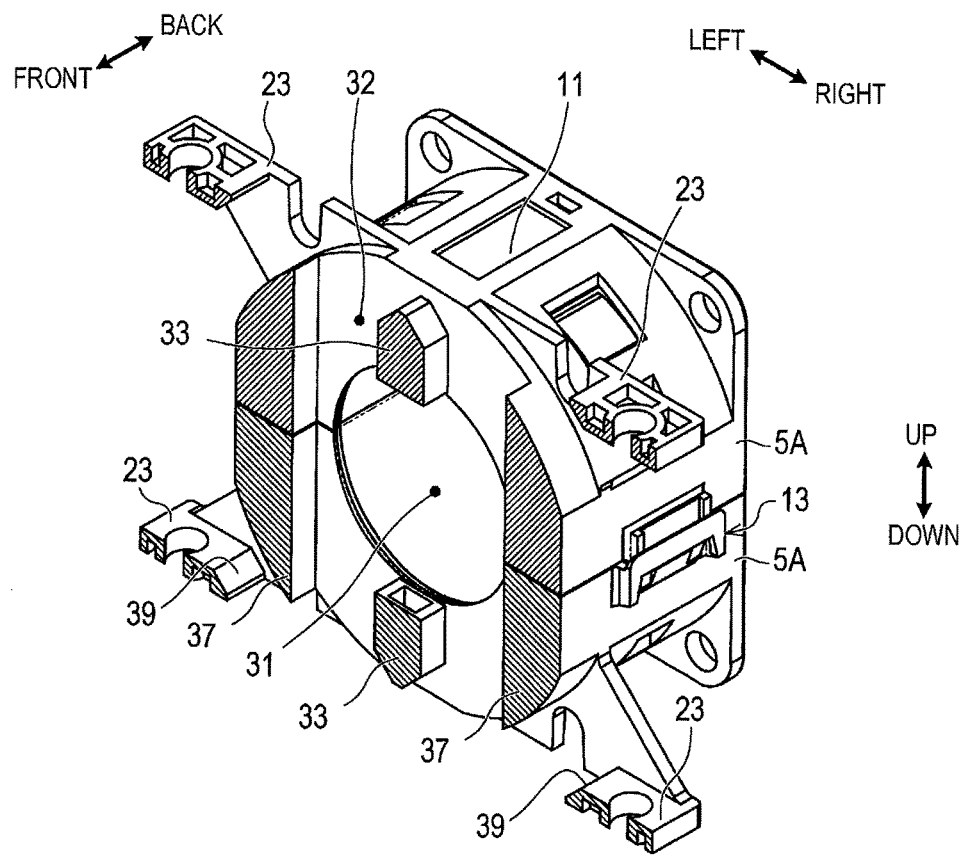
FIG. 5A is a perspective view illustrating the noise suppression member, cut longitudinally near the center in a front-back direction.

In the noise suppression member 1, a first through-hole 31 penetrating the two magnetic cores 3, 3 and the case 5 in an axial direction (the front-back direction defined in the drawings) is constituted and the two magnetic cores 3, 3 and the case 5 are configured such that the cable 2 is insertable through the first through-hole 31. Additionally, in the case 5, as illustrated in FIG. 5A, a second through-hole 32 penetrating the case 5 in a radial direction (a direction orthogonal to the front-back direction defined in the drawings; in the present embodiment, the up-down direction) is formed at a location between the magnetic cores 3, 3. The first through-hole 31 and the second through-hole 32 cross near the center of the noise suppression member 1 and are in communication with each other. A pair of band receivers 33 is provided at locations in an interior of the second through-hole 32 so as to sandwich the first through-hole 31 and be on both sides in a penetrating direction (both sides in the up-down direction defined in the drawings) of the second through-hole 32.

Figure 5B:
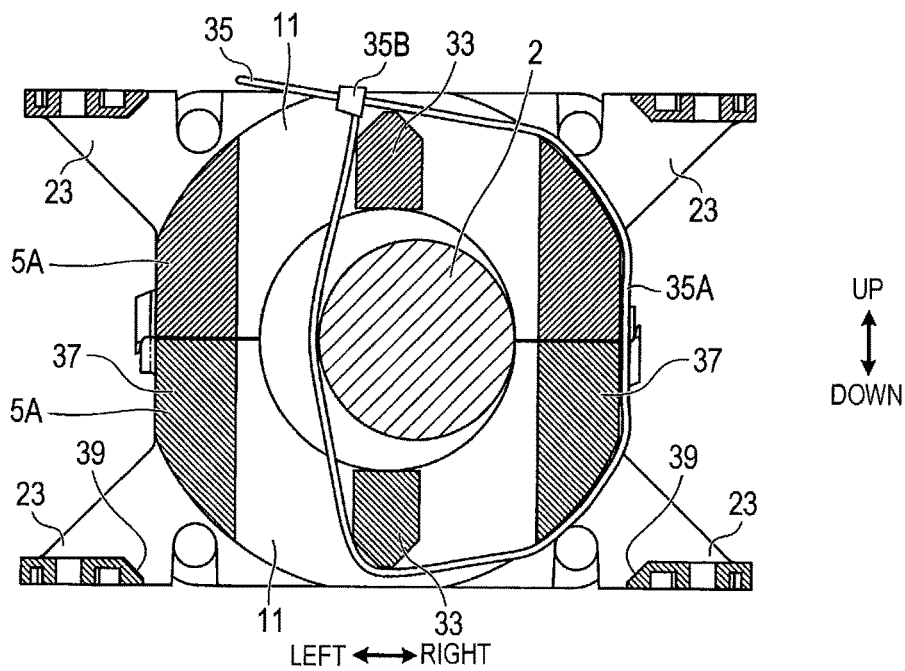
FIG. 5B is an explanatory diagram illustrating a state where a cable passed through the noise suppression member is restrained by a restraining member.

As illustrated in FIG. 5B, the second through-hole 32 and the pair of band receivers 33 are provided for attaching a restraining member 35 that restrains the cable 2 in a state of contact with the inner periphery of the magnetic cores 3. In the present embodiment, a binding band made from polyamide resin is used as the restraining member 35 (hereinafter also called "binding band 35"). Note that the material of the binding band 35 is not limited to polyamide resin and may be a different resin material. Additionally, a binding band made from a material other than resin, such as metal, may be used.

As commonly known, the binding band 35 is constituted by a band portion 35A formed into a strip-shape and a head portion 35B integrally formed on a first end of the band portion 35A, through which the band portion 35A can be passed. While detailed illustration is omitted, irregularities are repeatedly engraved in the band portion 35A along the longitudinal direction, and a tab that catches on the irregularities of the band portion 35A is formed in the head portion 35B. When a second end of the band portion 35A is inserted into the head portion 35B, the tab of the head portion 35B catches on the irregularities of the band portion 35A, forming a ratchet mechanism. In such a mechanism the band portion 35A can be displaced with respect to the head portion 35B in the insertion direction, but cannot be displaced in the pulling out direction.

As a result, when the second end of the band portion 35A is inserted into the head portion 35B such that the binding band 35 is formed into a loop shape, while a loop diameter can be reduced by pulling on the second end of the band portion 35A, the loop diameter cannot be enlarged. Accordingly, an object to be bound can be bound by the binding band 35 by pulling on the second end of the band portion 35A until the loop diameter becomes as small as possible, depending on the object to be bound that is inside the loop.

In the present embodiment, of side wall portions 37, 37 on both sides in a left-right direction defined in the drawings that sandwich the second through-hole 32, one of the side wall portion 37 and the pair of band receivers 33 are disposed on the inner peripheral side of the loop of the binding band 35, and are fastened together with the cable 2 as portions of the pair of housings 11, 11 by the binding band 35. The cable 2 is restrained in a state of contact with the inner periphery of the magnetic cores 3 by the binding band 35 described above.

Additionally, in the present embodiment, the binding band 35 also functions as a restraining member that restrains the pair of housings 11, 11 from separating from each other. Specifically, the pair of housings 11, 11 is configured to be separable in the up-down direction defined in the drawings (that is, the penetrating direction of the second through-hole 32) and, while separation of the pair of housings 11, 11 is prevented by the engagement of the four engagement mechanisms 13, 13, 13, 13, the binding band 35 functions to further prevent the separation of the pair of housings 11, 11. As a result, separation of the housings 11, 11 can be suppressed stronger than in a case where separation of the pair of housings 11, 11 is suppressed by only the four engagement mechanisms 13, 13, 13, 13. Additionally, separation of the housings 11, 11 can be suppressed by the binding band 35 even in cases where the engagement of the engagement mechanisms 13 has been released for some reason.

Particularly, in the present embodiment, the band receivers 33 are provided at the positions described above. As such, when fastening one of the side wall portions 37, the pair of band receivers 33, and the cable 2 together using the binding band 35, the pair of band receivers 33 tightens the pair of housings 11, 11 at the periphery of the first through-hole 31. Therefore, compared to a case where the pair of band receivers 33 is not provided, force acts in the up-down direction on the pair of housings 11, 11 at a position nearer to the center of the case 5, and the housings 11, 11 can be firmly held in place so as not to separate.

Additionally, an inclined surface 39, which forms a grade ascending outward from a center side in the left-right direction defined in the drawings, is provided on an inner side of the leg 23. When the noise suppression member 1 is attached to the attaching location using the two legs 23, 23, in cases where the first end of the binding band 35 inserted from above as defined in the drawings is pushed out, for example, to the right as defined in the drawings along the attaching location, the inclined surface 39 functions to guide the first end of the binding band 35 smoothly to the right of the leg 23.

Figure 6A:
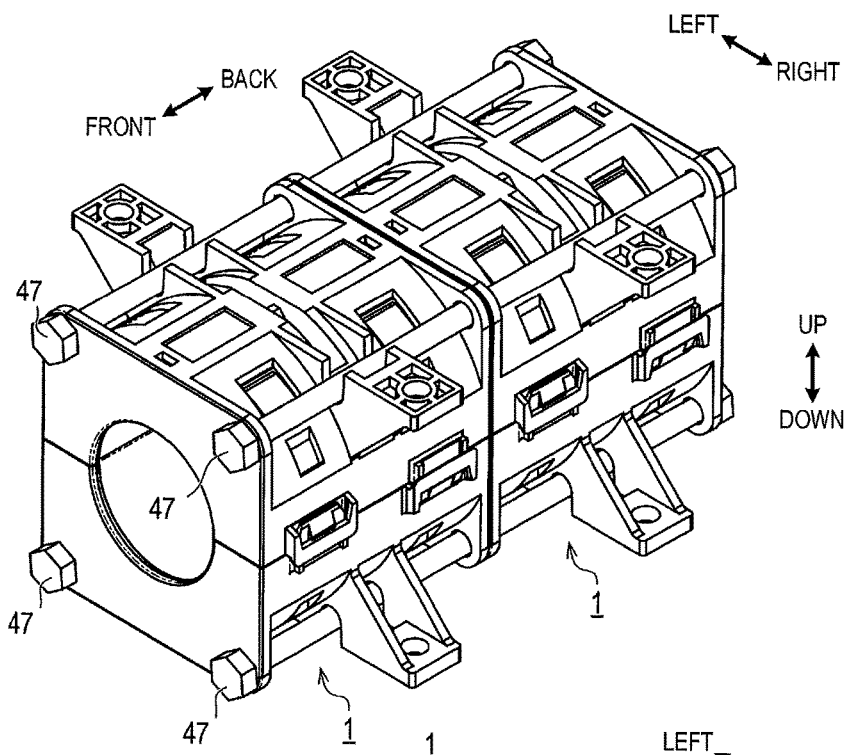
FIG. 6A is a perspective view illustrating an example of a plurality of the noise suppression members being coupled and integrated.
Figure 6B:
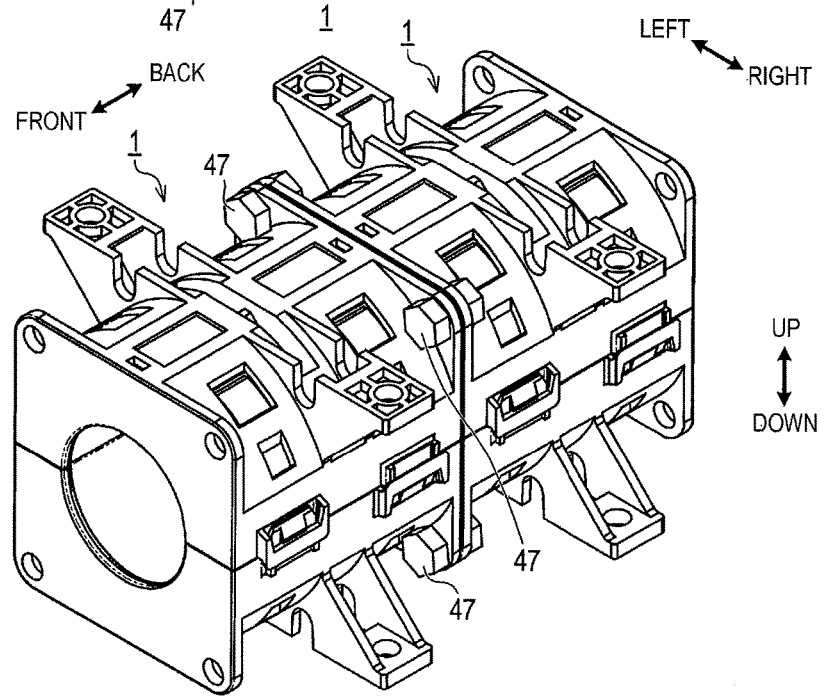
FIG. 6B is a perspective view illustrating another example of a plurality of the noise suppression members being coupled and integrated.

Furthermore, flanges 41, 41 which, in a front view or a back view, appear as roughly quadrangular are provided on both edges of the case 5 in the front-back direction defined in the drawings. Four coupling holes 43, 43, 43, 43 penetrating in the front-back direction defined in the drawings are provided in each of the flanges 41. Additionally, notches 45, 45 are provided in each of the legs 23. As illustrated in FIGS. 6A and 6B, these configurations are used when arranging and coupling a plurality of the noise suppression members 1 in the axial direction using a coupling member 47 (a bolt and nut in the present embodiment).

In the case of the noise suppression member 1 illustrated in FIG. 6A, the coupling member 47 is constituted by a bolt with a shaft length that spans the plurality of the noise suppression members 1 and a nut that screws onto the bolt. The notches 45 are used for passing the bolt shafts when configuring such a coupled structure. With such a coupled structure, a single bolt can be used to couple a plurality of the noise suppression members 1. On the other hand, in the case of the noise suppression member 1 illustrated in FIG. 6B, the coupling member 47 is constituted by a bolt with a shaft length capable of coupling the noise suppression members 1 at adjacent positions and a nut that screws onto the bolt. With this type of coupled structure as well, a plurality of the noise suppression members 1 can be coupled. The type of coupled structure to be used can be selected as desired taking into consideration the number of the noise suppression members 1 to be coupled, the labor required to couple the members, and the cost of the coupling member 47.

(2) Beneficial Effects

According to the noise suppression member 1 described above, a plurality (two in the present embodiment) of the magnetic cores 3 can be housed in the case 5, and the restraining member 35 (the binding band 35) described above can be attached to the location between the magnetic cores 3, 3 disposed in the case 5 at adjacent positions that are separated by a space. When the restraining member 35 is attached to the case 5, the restraining member 35 comes into contact with the cable 2 passing through the inner peripheral side of the magnetic cores 3 and, thus, restrains the cable 2 in a state of contact with the inner periphery of the magnetic cores 3.

Therefore, the cable 2 can be brought into contact with the inner periphery of the magnetic cores 3 on both sides between which the restraining member 35 is interposed. Accordingly, compared to, for example, a configuration in which the cable 2 is brought close to the inner periphery of a single magnetic core 3 at a location outward of an edge of the magnetic core 3, with the present invention, the cable 2 can be disposed close to the inner periphery of the magnetic core 3 across a greater range. As a result, the impedance characteristics of the noise suppression member 1 can be enhanced and the effects of countering electromagnetic waves can be enhanced.

Additionally, in the present embodiment, when the restraining member 35 is attached to the case 5, the restraining member 35 restrains the pair of housings 11, 11 from separating from each other. Therefore, the pair of housings 11, 11 can be firmly fixed to each other compared to a case where the pair of housings 11, 11 is fixed to each other by only the engagement mechanisms 13. Additionally, even in cases where the engagement of the engagement mechanisms 13 has been released for some reason, due to the restraining member 35, the risk of the pair of housings 11, 11 separating can be reduced.

Additionally, in the present embodiment, by using the binding band 35 as the restraining member, the cable 2 can be restrained in a state of contact with the inner periphery of the magnetic cores 3, and the pair of housings 11, 11 can be restrained from separating from each other. Therefore, the desired effects can be obtained using a binding band of higher generality without preparing a specially designed restraining member.

Additionally, in the present embodiment, the band receivers 33 are provided at locations in the interior of the second through-hole 32 so as to sandwich the first through-hole 31 and be on both sides in the penetrating direction of the second through-hole 32. When the binding band 35 is formed into a loop shape, the band receivers 33 are disposed on the inner peripheral side of the loop and are fastened together with the cable 2 as portions of the pair of housings 11, 11 by the binding band 35. Therefore, the tightening load by the binding band 35 can be applied to positions sandwiching the first through-hole 31 and, as a result, the pair of housings 11, 11 can be firmly held in place at the periphery of the first through-hole 31 through which the cable 2 passes, and separating of the pair of housings 11, 11 can be suppressed.

Additionally, in the present embodiment, a plurality of the noise suppression members 1 can be arranged in the axial direction and integrally coupled. Therefore, in cases where sufficient effects of countering electromagnetic waves cannot be ensured by a single noise suppression member 1, the effects of countering electromagnetic waves can be increased by integrating a plurality of the noise suppression members 1. Additionally, by integrating the plurality of the noise suppression member 1, the plurality of the noise suppression members 1 can be more orderly arranged than in a case where the plurality of the noise suppression members 1 is disjointed.

(3) Supplementary Description

An exemplary embodiment has been used to describe the noise suppression member, but this embodiment should not be construed to be any more than an example of one form of the present invention. In other words, the present invention is not limited to the exemplary embodiment described above and can be embodied in various forms without departing from the technical concept of the invention.

For example, in the embodiment described above, an example has been described in which the two case parts 5A, 5A are completely separate members, and the housing 11 and the constituents of the engagement mechanisms 13 (the engaging portion 13A and the engaged portion 13B) are provided in each of the case parts 5A. However, the present invention is not limited thereto. For example, one of the housings 11 and the other of the housings 11 may be coupled via a hinge. In this case as well, the configuration described in the present specification can be used and the desired effects can be obtained.

Additionally, in the embodiment described above, the pair of housings 11, 11 is held in place near the center of the case 5 so as not to separate by providing the pair of band receivers 33. However, in cases where such strong holding is not needed, the band receivers 33 need not be provided. In other words, whether or not the band receivers 33 are provided is optional. In cases where the band receivers 33 are not provided, it is possible to restrain the cable 2 with a binding band 35 that is shorter by a length required to pass around the band receivers 33. Therefore, in cases where such a point is important, a configuration in which the band receivers 33 are not provided is preferable.

Additionally, in the embodiment described above, the flanges 41, 41 are provided on the case 5, but whether or not the flanges 41, 41 are provided is optional.

Moreover, in the embodiment described above, an example is given in which the binding band 35 is used as the restraining member, but the functions required from the restraining member are the following two points:

1. The restraining member 35 must be able to be attached to a location between the magnetic cores 3, 3 disposed in the case 5 at adjacent positions that are separated by a space; and 2. When the restraining member 35 is attached to the case 5, the restraining member 35 must restrain the cable 2 in a state of contact with the inner periphery of the magnetic cores 3 by coming into contact with the cable 2 passing through the inner peripheral side of the magnetic cores 3. Therefore, provided that these functions can be satisfied, the specific form of the restraining member is not limited, and whether or not the restraining member is configured with a form equivalent to the binding band is optional.

Figures 7A, 7B:
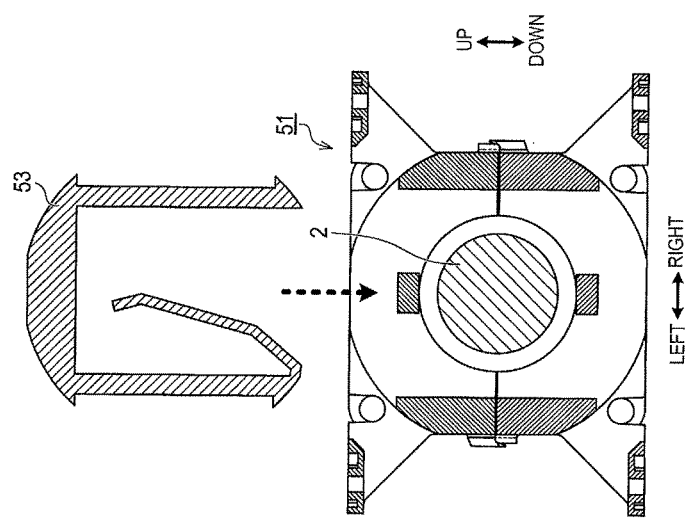
FIG. 7A is an explanatory diagram illustrating an example of a restraining member other than a binding band.
FIG. 7B is an explanatory diagram illustrating an example of a restraining member other than a binding band.

To provide a more specific example, for example, a dedicated restraining member 53 may be prepared, as in a noise suppression member 51 illustrated in FIGS. 7A and 7B. In this case as well, when the restraining member 53 is attached to the case 55, the restraining member 53 comes into contact with the cable 2 and, thus, the cable 2 can be brought into contact with the inner periphery of the magnetic core.

Additionally, in the embodiment described above, an example has been given in which two magnetic cores 3, 3 are housed in the case 5, but the number of the magnetic cores 3 may be configured to be three or more. In such a case as well, two magnetic cores 3, 3, of the three or more magnetic cores 3, 3, 3 . . . , disposed in the case 5 at adjacent positions that are separated by a space are selected as a pair, and the restraining member is attached to a location between these magnetic cores 3, 3.

Additionally, in the embodiment described above, an example has been given of the case 5 in which there is one attaching location where the restraining member 35 can be attached (the location where the second through-hole 32 is formed), but two or more attaching locations for the restraining member may be provided in the case. In this case, one location of the two or more attaching locations may be selected and the restraining member may be attached thereto, or two or more locations may be selected and the restraining member may be attached to each location. If the restraining members are attached to two or more locations, it is possible to bring the cable into contact with the inner periphery of the magnetic cores across a broader range and, as a result, noise-reducing effects can be enhanced. Additionally, the risk of the pair of housings opening can be further reduced.

Note that as is clear from the exemplary embodiment described above, the noise suppression member described in the present specification may be further provided with configurations such as those given below.

First, with the noise suppression member described in the present specification, the pair of housings may be configured to be bound to each other in an inseparable state by the restraining member due to the restraining member coming into contact with each of the pair of housings when the restraining member is attached to the case.

With a noise suppression member configured thusly, when the restraining member is attached to the case, the restraining member restrains the pair of housings from separating from each other. Therefore, the pair of housings can be firmly fixed to each other compared to a case where the pair of housings is fixed to each other by only the engagement mechanisms. Additionally, even in cases where the engagement of the engagement mechanisms has been released for some reason, due to the restraining member, the risk of the pair of housings separating can be reduced.

Additionally, the noise suppression member described in the present specification may further include a first through-hole penetrating the magnetic cores and the case in the axial direction; and a second through-hole penetrating the case in the radial direction at the location between the magnetic cores disposed in the case at adjacent positions that are separated by a space and communicating with the first through-hole in an interior of the case; the pair of housings being configured to be separable in the same direction as the penetrating direction of the second through-hole when the engagement of the engagement mechanism is released; and due to the cable passing through the first through-hole, the restraining member, namely a binding band, passing through the second through-hole to be formed into a loop shape, and the cable and a portion of the pair of housings located on an inner peripheral side of the loop being fastened together, the cable being restrained in a state of contact with the inner periphery of the magnetic cores by the binding band, and the pair of housings being configured to be bound to each other in an inseparable state by the binding band.

With a noise suppression member configured thusly, by using the binding band as the restraining member, the cable can be restrained in a state of contact with the inner periphery of the magnetic cores, and the pair of housings can be restrained from separating from each other. Therefore, the desired effects can be obtained using a binding band of higher generality without preparing a specially designed restraining member.

The noise suppression member described in the present specification may further include a pair of band receivers provided at locations in an interior of the second through-hole so as to sandwich the first through-hole and be on both sides in the penetrating direction of the second through-hole; wherein when the binding band is formed into a loop shape, the pair of band receivers is disposed on the inner peripheral side of the loop, and is fastened together with the cable as the portion of the pair of housings by the binding band.

With a noise suppression member configured thusly, the band receivers are provided at locations in the interior of the second through-hole so as to sandwich the first through-hole and be on both sides in the penetrating direction of the second through-hole. When the binding band is formed into a loop shape, the band receivers are disposed on the inner peripheral side of the loop and are fastened together with the cable as portions of the pair of housings by the binding band. Therefore, the tightening load by the binding band can be applied to positions sandwiching the first through-hole and, as a result, the pair of housings can be firmly held in place at the periphery of the first through-hole through which the cable passes, and separating of the pair of housings can be suppressed.

In the noise suppression member described in the present specification, a plurality of the noise suppression members may be provided; and the plurality of noise suppression members may be configured to be integrable by being arranged and coupled in the axial direction.

With a noise suppression member configured thusly, a plurality of the noise suppression members can be arranged in the axial direction and integrally coupled. Therefore, in cases where sufficient effects of countering electromagnetic waves cannot be ensured by a single noise suppression member, the effects of countering electromagnetic waves can be increased by integrating a plurality of the noise suppression members. Additionally, by integrating the plurality of noise suppression members, the plurality of noise suppression members can be more orderly arranged than in a case where the plurality of noise suppression members is disjointed.

REFERENCE SIGNS LIST

1 Noise suppression member
2 Cable
3 Magnetic core
3A Split core
5 Case
5A Case part
7 Metal spring
11 Housing
13 Engagement mechanism
13A Engaging portion
13B Engaged portion
15 Resin spring
17 Protrusion
19 Protrusion receiving hole
21 Through-bore
23 Leg
25 Attachment hole
31 First through-hole
32 Second through-hole
33 Band receiver
35 Restraining member
35 Binding band
35A Band portion
35B Head portion
37 Side wall portion
39 Inclined surface
41 Flange
43 Coupling hole
45 Notch
47 Coupling member
51 Noise suppression member 53 Restraining member
55 Case

The invention claimed is:

1. A noise suppression member comprising:
a plurality of magnetic cores, each being configured in an annular shape; and
a case for arranging and housing the plurality of magnetic cores in an axial direction orthogonal to a radial direction of each of the plurality of magnetic cores;
each of the plurality of magnetic cores being formed into the annular shape by bringing a pair of split cores constituted by a magnetic material into contact with each other;
the case including a pair of housings and an engagement mechanism capable of mutually fixing the pair of housings;
the plurality of magnetic cores being constituted by a plurality of the split cores housed in a first housing of the pair of housings and a plurality of the split cores housed in a second housing of the pair of housings being brought into contact with each other on a one-to-one basis as a result of the pair of housings being mutually fixed by the engagement mechanism; and
the noise suppression member being configured such that a restraining member can be attached, the restraining member restraining a cable in a state of contact with an inner periphery of the plurality of magnetic cores at a location between an adjacent two of the plurality of magnetic cores, by coming into contact with the cable passing through an inner peripheral side of the plurality of magnetic cores.

2. The noise suppression member according to claim 1, wherein:
the pair of housings is configured to be bound to each other in an inseparable state by the restraining member due to the restraining member coming into contact with each of the pair of housings when the restraining member is attached to the case.

3. The noise suppression member according to claim 2, further comprising:
a first through-hole penetrating the plurality of magnetic cores and the case in the axial direction; and
a second through-hole penetrating the case in the radial direction at the location between an adjacent two of the plurality of magnetic cores and communicating with the first through-hole in an interior of the case;
the pair of housings being configured to be separable in a same direction as a penetrating direction of the second through-hole when the engagement of the engagement mechanism is released; and
due to the cable passing through the first through-hole, the restraining member, namely a binding band, passing through the second through-hole to be formed in a loop shape, and the cable and a portion of the pair of housings located on an inner peripheral side of the loop being fastened together by the binding band, the cable being restrained in a state of contact with the inner periphery of the plurality of magnetic cores by the binding band, and the pair of housings being configured to be bound to each other in an inseparable state by the binding band.

4. The noise suppression member according to claim 3, further comprising:
a pair of band receivers provided at locations in an interior of the second through-hole so as to sandwich the first through-hole and be on both sides in the penetrating direction of the second through-hole; wherein
when the binding band is formed in the loop shape, the pair of band receivers is disposed on the inner peripheral side of the loop, and is fastened together with the cable as the portion of the pair of housings by the binding band.

5. The noise suppression member according to claim 1, wherein:
a plurality of the noise suppression members are configured to be integrable by being arranged and coupled in the axial direction.

* * * * *